United States Patent
Chiu

(10) Patent No.: US 6,922,095 B2
(45) Date of Patent: Jul. 26, 2005

(54) VOLTAGE LEVEL SHIFTER IMPLEMENTED BY ESSENTIALLY PMOS TRANSISTORS

(75) Inventor: Chaung-Ming Chiu, Taoyuan (TW)

(73) Assignee: Toppoly Optoelectronics Corp. (TW)

( * ) Notice: Subject to any disclaimer, the term of this patent is extended or adjusted under 35 U.S.C. 154(b) by 0 days.

(21) Appl. No.: 10/692,098

(22) Filed: Oct. 23, 2003

(65) Prior Publication Data
US 2004/0084696 A1 May 6, 2004

(30) Foreign Application Priority Data
Oct. 25, 2002 (TW) ........................................ 91125179 A

(51) Int. Cl.[7] .............................................. H03L 5/00
(52) U.S. Cl. ....................................... 327/333; 327/112
(58) Field of Search .............................. 327/112, 333; 326/62–63, 68, 80–81

(56) References Cited

U.S. PATENT DOCUMENTS 6,756,835 B2 * 6/2004 Yu .............................. 327/333

2002/0158666 A1 * 10/2002 Azami et al. ................. 326/83

* cited by examiner

Primary Examiner—Quan Tra
(74) Attorney, Agent, or Firm—Madson & Metcalf

(57) ABSTRACT

A voltage level shifter includes a front stage circuit periodically generating a first control signal and a second control signal in response to a first input clock signal and a second input clock signal complementary to the first input clock signal; a switch circuit including two PMOS transistors connected between a maximum voltage and a minimum voltage in series, wherein a third control signal is outputted from a conjunction of the two PMOS transistors, and the first and second control signals are coupled to the gate electrodes of the two PMOS transistors, respectively; and a driving circuit receiving the third control signal and outputting an output clock signal having a peak-to-peak value larger than a peak-to-peak value of the input clock signal. The voltage level shifter is implemented by essentially PMOS transistors.

10 Claims, 7 Drawing Sheets

VOLTAGE LEVEL SHIFTER IMPLEMENTED BY ESSENTIALLY PMOS TRANSISTORS

FIELD OF THE INVENTION

The present invention relates to a voltage level shifter, and more particularly to a voltage level shifter implemented by essentially PMOS transistors, which can be integrated into a manufacturing process of a liquid crystal display panel.

BACKGROUND OF THE INVENTION

With the technology development, a computer becomes an essential electrical appliance for each family. The image quality of the monitor or display for use with the computer is as important as the operation speed and performance of the computer. Since conventional cathode-ray-tube (CRT) monitors are space-inefficient and suffer from high radiation, a liquid crystal display (LCD) has taken the place of the conventional monitors to become the main stem.

Generally, when the LCD panel is operated, a driving circuit is required to perform a scanning operation to store the displayed data into pixels of liquid crystal display (LCD) in sequence. In this driving circuit, a voltage level shifter is used to convert a clock signal at a low voltage level into a clock signal at a high voltage level. Since the peak-to-peak value of the clock signal at the high voltage level is larger than that of the clock signal at the low voltage, level, the clock signal at the high voltage level is more powerful than the low level one to drive the rear-stage circuit and further the LCD panel.

A conventional voltage level shifter includes the combination of the PMOS and NMOS transistors. Therefore, the IC manufacturing process involves both the PMOS transistor process and the NMOS transistor process and thus is very complicated.

Currently, the production of an LCD panel includes one of essentially NMOS, PMOS transistor process and CMOS transistor process. The essentially NMOS and CMOS transistor processes undesirably involves too many masking steps so that the PMOS manufacturing process, so far, is the most popular for producing the LCD panel.

However, even if the LCD panel can be produced by the essentially PMOS transistor process, NMOS transistor process is still required if the voltage level shifter is integrated into the panel. Therefore, the process for producing the combined LCD panel and voltage level shifter is still complicated, and the yield is unsatisfactory.

Therefore, the purpose of the present invention is to simplify the manufacturing process of the combined LCD panel and voltage level shifter to deal with the above situations encountered in the prior art.

SUMMARY OF THE INVENTION

An object of the present invention is to provide a voltage level shifter implemented by essentially PMOS transistor process to facilitate the integration of the voltage level shifter into the LCD panel.

A first aspect of the present invention relates to a voltage level shifter comprising a front stage circuit periodically generating a first control signal and a second control signal in response to a first input clock signal and a second input clock signal complementary to the first input clock signal; a switch circuit including two PMOS transistors connected between a maximum voltage and a minimum voltage in series, wherein a third control signal is outputted from a conjunction of the two PMOS transistors, and the first and second control signals are coupled to the gate electrodes of the two PMOS transistors, respectively; and a driving circuit receiving the third control signal and outputting an output clock signal having a peak-to-peak value larger than a peak-to-peak value of the input clock signal.

Preferably, the front stage circuit includes a first PMOS transistor having the gate and drain electrodes connected to each other and further coupled to the first input clock signal, and the source electrode serving as an output terminal of the first control signal; a second PMOS transistor having the gate electrode serving as an output end of the second control signal, the drain electrode coupled to the output end of the first control signal and the source electrode coupled to the maximum voltage; a third PMOS transistor having the gate and drain electrodes connected to each other and further coupled to the second input clock signal, and the source electrode coupled to the output end of the second control signal; and a fourth PMOS transistor having the gate electrode coupled to the first input clock signal, the drain electrode coupled to the output end of the second control signal and the source electrode coupled to the maximum voltage.

Preferably, the driving circuit includes a fifth PMOS transistor having the gate electrode coupled to the third control signal, the source electrode coupled to the maximum voltage and the drain electrode serving as a voltage node; a sixth PMOS transistor having the gate and drain electrodes connected to each other and further coupled to the minimum voltage and the source electrode coupled to the voltage node; a seventh PMOS transistor having the gate electrode coupled to the voltage node, the source electrode coupled to the output end of the output clock signal and the drain electrode coupled to the minimum voltage; and an eighth PMOS transistor having the gate electrode coupled to the third control signal, the drain electrode coupled to the output end of the output clock signal, and the source electrode coupled to the maximum voltage.

A voltage level shifter according to a second aspect of the present invention comprises a first PMOS transistor having the gate electrode and the drain electrode connected to each other and further coupled to an input clock signal and the source electrode serving as an output end of a first control signal; a second PMOS transistor having the gate electrode serving as an output end of a second control signal, the drain electrode coupled to the output end of the first control signal and the source electrode coupled to a maximum voltage; a third PMOS transistor having the gate electrode and the drain electrode connected to each other and further coupled to a complementary signal relative to the input clock signal, the source electrode coupled to the output end of the second control signal; a fourth PMOS transistor having the gate electrode coupled to the input clock signal, the drain electrode coupled to the output end of the second control signal and the source electrode coupled to the maximum voltage; a switch circuit periodically generating a third control signal in response to the first and second control signals; and a driving circuit receiving the third control signal and outputting an output clock signal having a peak-to-peak value larger than a peak-to-peak value of the input clock signal.

Preferably, the switch circuit includes a fifth PMOS transistor having the gate electrode coupled to the first control signal, the drain electrode coupled to a minimum voltage and the source electrode serving as an output end of the third control signal; and a sixth PMOS transistor having the gate electrode coupled to the second control signal, the drain electrode coupled the output end of the third control signal and the source electrode coupled to the maximum voltage.

Preferably, the driving circuit includes a seventh PMOS transistor having the gate electrode coupled to the third control signal, the source electrode coupled to the maximum voltage and the drain electrode serving as a voltage node; an eighth PMOS transistor having the gate and drain electrodes connected to each other and further coupled to the minimum voltage and the source electrode coupled to the voltage node; a ninth PMOS transistor having the gate electrode coupled to the voltage node, the source electrode coupled to the output end of the output clock signal and the drain electrode coupled to the minimum voltage; and a tenth PMOS transistor having the gate electrode coupled to the third control signal, the drain electrode coupled to the output end of the output clock signal, and the source electrode coupled to the maximum voltage.

A third aspect of the present invention relates to a voltage level shifter for converting an input signal into an output clock signal. The voltage level shifter comprises a front stage circuit periodically generating a first control signal and a second control signal in response to the input clock signal and a complementary clock signal relative to the input clock signal; a switch circuit periodically generating a third control signal in response to the first and second control signals; a first PMOS transistor having the gate electrode coupled to the third control signal, the source electrode coupled to a maximum voltage and the drain electrode serving as a voltage node; a second PMOS transistor having the gate and drain electrodes connected to each other and further coupled to a minimum voltage and the source electrode coupled to the voltage node; a third PMOS transistor having the gate electrode coupled to the voltage node, the source electrode coupled to an output end of the output clock signal and the drain electrode coupled to the minimum voltage; and a fourth PMOS transistor having the gate electrode coupled to the third control signal, the drain electrode coupled to the output end of the output clock signal, and the source electrode coupled to the maximum voltage.

Preferably, the front stage circuit includes a fifth PMOS transistor having the gate and drain electrodes connected to each other and further coupled to the input clock signal, and the source electrode serving as an output end of the first control signal; a sixth PMOS transistor having the gate electrode serving as an output end of the second control signal, the drain electrode coupled to the output end of the first control signal and the source electrode coupled to the maximum voltage; a seventh PMOS transistor having the gate and drain electrodes connected to each other and further coupled to the complementary clock signal, and the source electrode coupled to the output end of the second control signal; and an eighth PMOS transistor having the gate electrode coupled to the input clock signal, the drain electrode coupled to the output end of the second control signal and the source electrode coupled to the maximum voltage.

Preferably, the switch circuit includes a ninth PMOS transistor having the gate electrode coupled to the first control signal, the drain electrode coupled to the minimum voltage and the source electrode serving as an output end of the third control signal; and a tenth PMOS transistor having the gate electrode coupled to the second control signal, the drain electrode coupled the output end of the third control signal and the source electrode coupled to the maximum voltage.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In order to efficiently combine the manufacturing processes of the LCD panel and the voltage level shifter, a voltage level shifter implemented by essentially PMOS transistors is provided according to the present invention.

Figure 1:
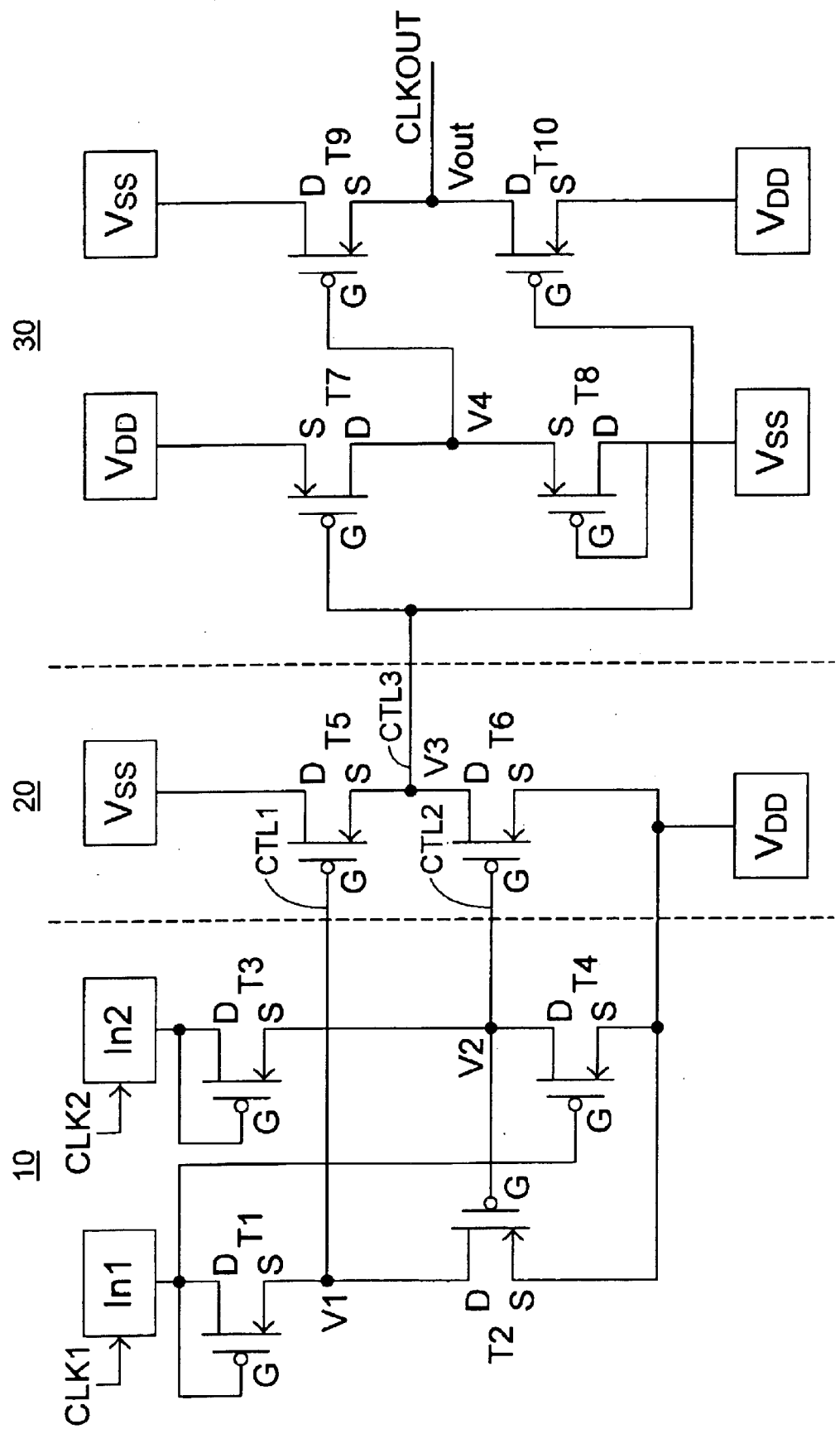
FIG. 1 is a schematic circuit diagram showing a preferred embodiment of a voltage level shifter according to the present invention.

Please refer to FIG. 1 which is a schematic circuit diagram showing a preferred embodiment of a voltage level shifter according to the present invention. In the figure, the symbols Vdd and Vss represent the maximum and the minimum voltages, and In1 and In2 represent input terminals for receiving therefrom a pair of complementary input clock signals CLK1 and CLK2. Accordingly, when In1 is at a high level, In2 will be at a low level; on the contrary, when In1 is at a low level, In2 will be at a high level. For example, the voltage values at Vdd, Vss, In1 and In2 can be 6V, −12V, 0V and −3.3V, respectively. Alternatively, the voltage values at Vdd, Vss, In1 and In2 can be 6V, −12V, −3.3V and 0V, respectively.

The voltage level shifter shown in FIG. 1 includes a front stage circuit 10, a switch circuit 20 and a driving circuit 30. In the front stage circuit 10, further referring to FIG. 2A or 2B, the gate electrode G and drain electrode D of the transistor T1 are coupled to the input terminal In1, and the source electrode S of the transistor T1 represents a first voltage node V1. The transistor T2 has a gate electrode G serving as a second voltage node V2, a drain electrode D coupled to the first voltage node V1, and a source electrode S coupled to Vdd. The gate electrode G and drain electrode D of the transistor T3 are coupled to the input terminal In2, and the source electrode S of the transistor T3 is coupled to the second voltage node V2. The transistor T4 has a gate electrode G coupled to the terminal In1, a drain electrode D coupled to the second voltage node V2, and a source electrode S coupled to Vdd.

Figure 3A:
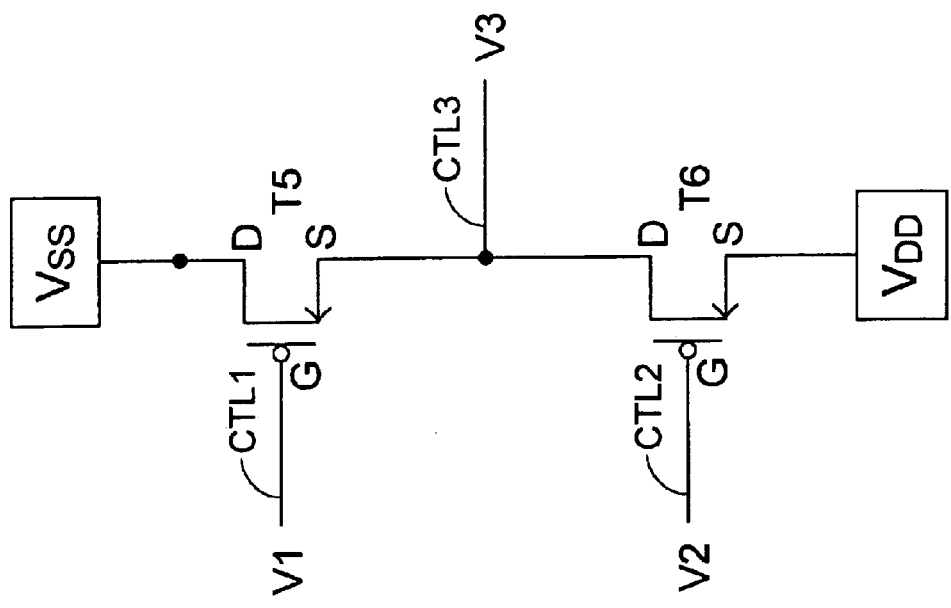
FIG. 3A specifically shows the switch circuit included in the voltage level shifter of FIG. 1.

In the switch circuit 20, further referring to FIG. 3A, the transistor T5 has a gate electrode G coupled to the first voltage node V1, a drain electrode D coupled to Vss, and a source electrode S coupled to a third voltage node V3. The transistor T6 has a gate electrode G coupled to the second voltage node V2, a drain electrode D coupled to the third voltage node V3, and a source electrode S coupled to Vdd.

Figure 4A:
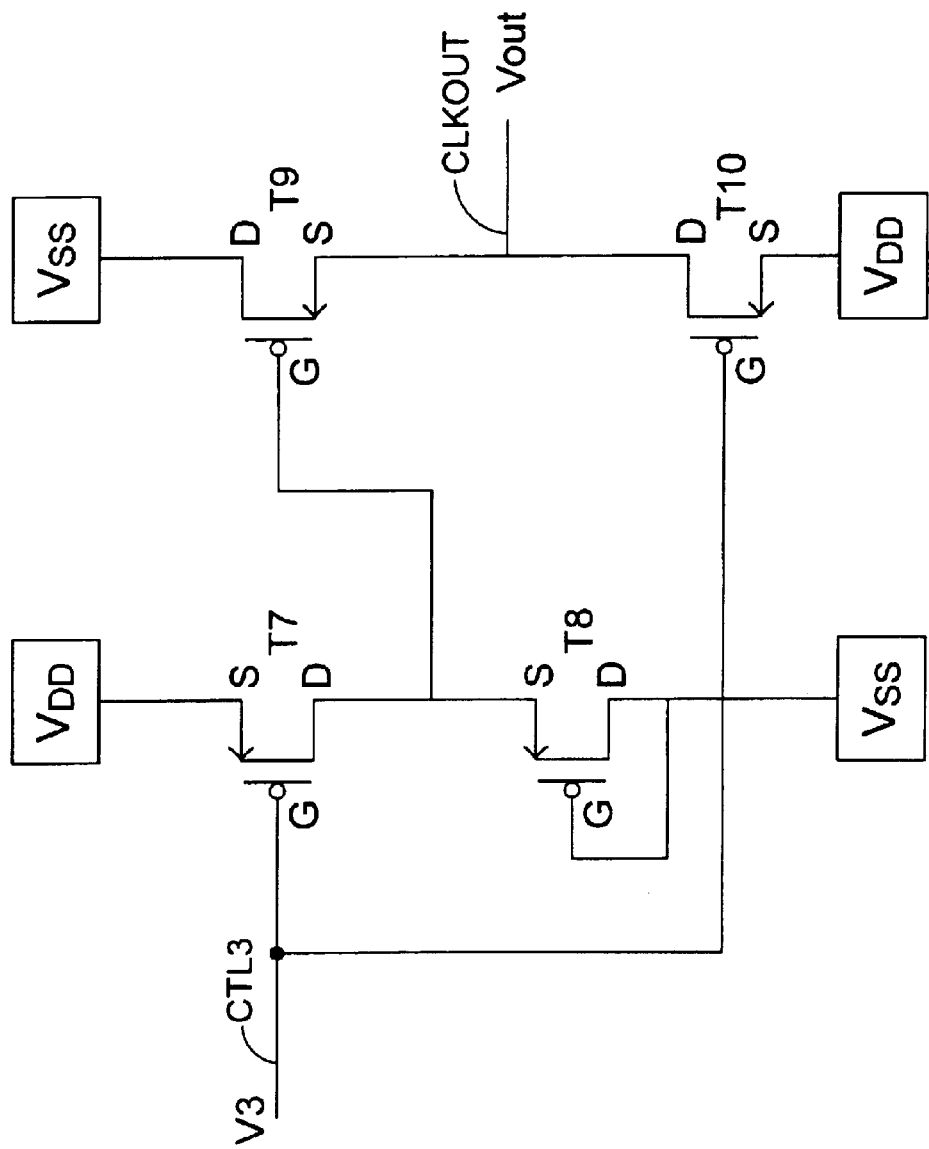
FIG. 4A specifically shows the driving circuit included in the voltage level shifter of FIG. 1.

In the driving circuit 30, further referring to FIG. 4A, the transistor T7 has a gate electrode G coupled to the third voltage node V3, a drain electrode D serving as a fourth voltage node V4, and a source electrode S coupled to the Vdd. The gate electrode G and drain electrode D of the transistor T8 are coupled to Vss, and the source electrode S of the transistor T8 is coupled to the fourth voltage node V4. The transistor T9 has a gate electrode G coupled to the fourth voltage node V4, a drain electrode D coupled to Vss, and a source electrode S represents the output voltage end Vout. The transistor T10 has a gate electrode G coupled to the third voltage node V3, a drain electrode D coupled to the output voltage node Vout, and a source electrode S coupled to Vdd.

Examples will be given as follows to show how the voltage level shifter implemented by essentially PMOS transistors according to the present invention works. It is to be noted that the following description can be understood by those skilled in the art based on the understanding about the features of the PMOS transistors. For example, the threshold voltage ($V_t$) is smaller than zero. When $V_{GS}$ is less than $V_t$, the PMOS transistor is turned on. Once the PMOS transistor is turned on at a triode region, $V_{GD}$ is less than or equal to $V_t$, and drain current is $K[2(V_{GS}-V_t)V_{DS}-V_{DS}^2]$ where K is a device parameter. On the other hand, if $V_{GD}$ is greater than $V_t$, i.e. a saturation region is entered, the drain current is $K(V_{GS}-V_t)^2$.

Figure 2B:
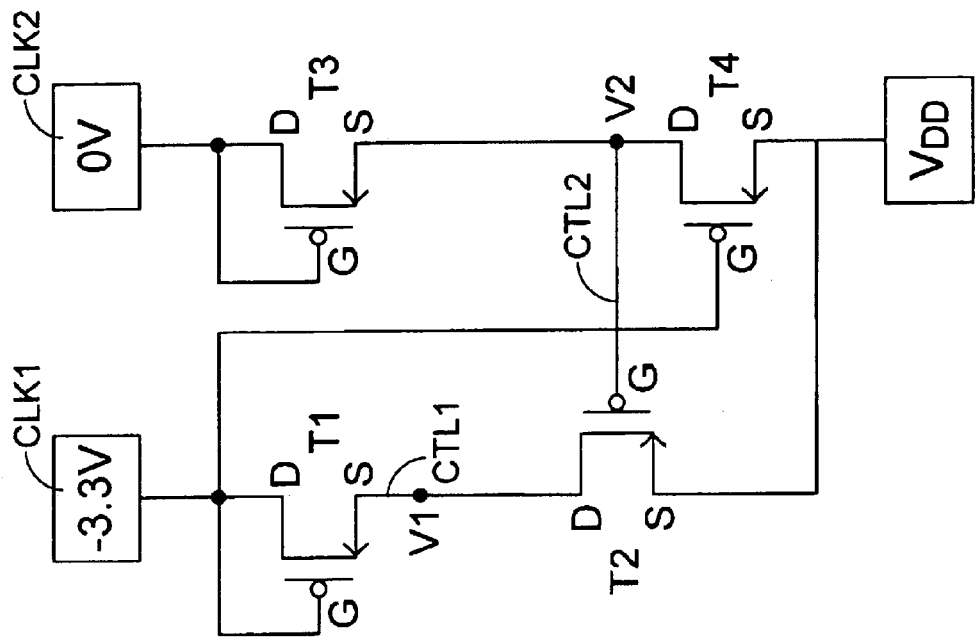
FIGS. 2A and 2B are examples of a front stage circuit included in the voltage level shifter of FIG. 1, wherein the levels of the input clock signal In1 and In2 vary.
Figure 2A:
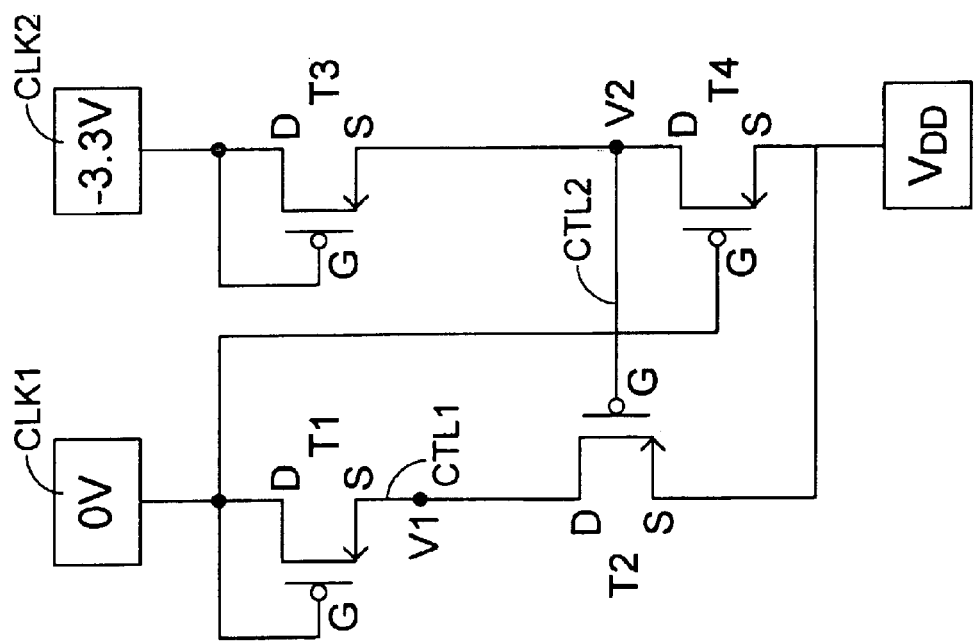
Figure 2C:
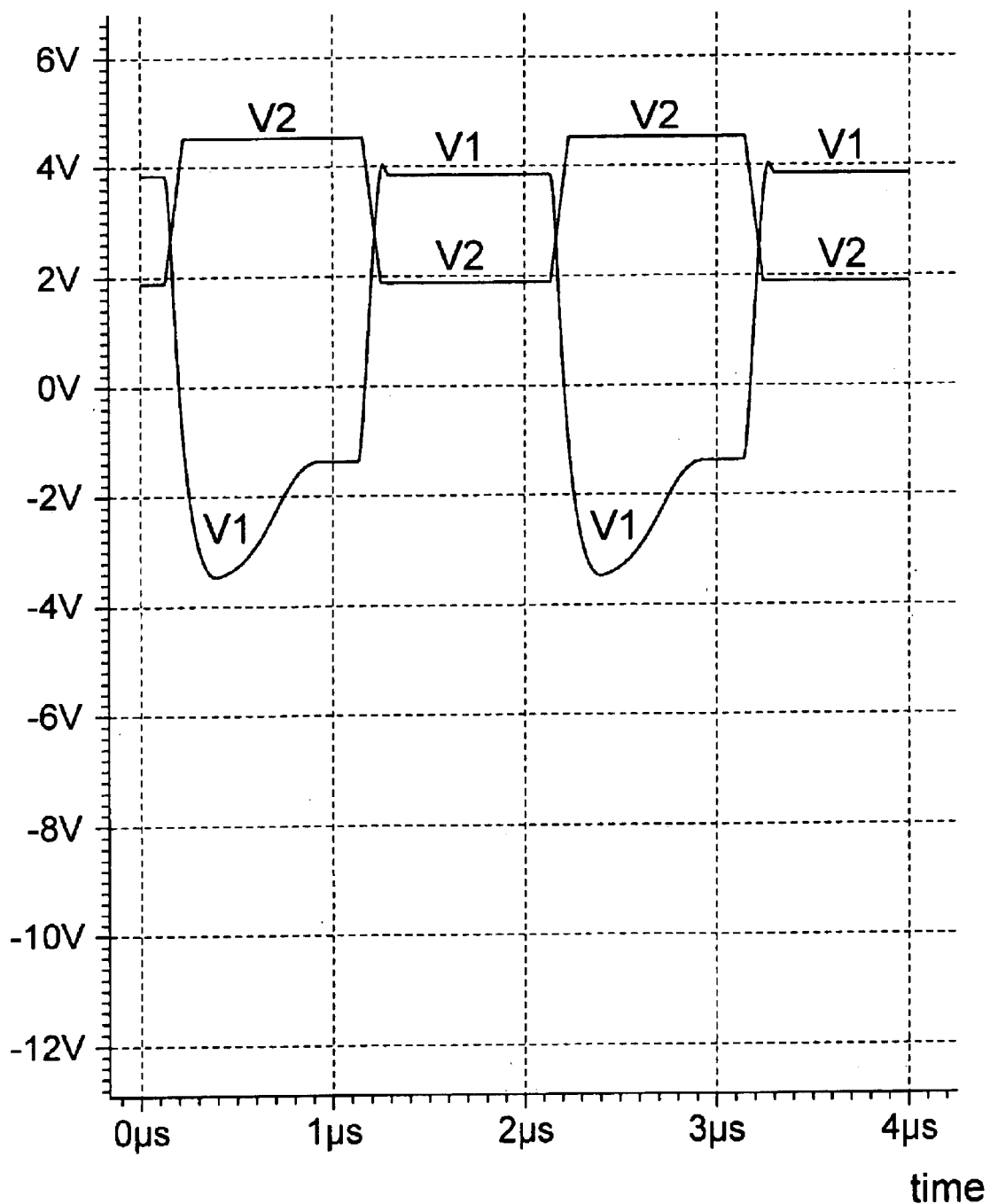
FIG. 2C is a voltage vs. time plot showing the relationship of voltages between the first voltage node V1 and the second voltage node V2.

In the example with reference to FIG. 2A, the level of the input clock signal CLK1 is high at the input terminal In1 and meanwhile, the level of the complementary input clock signal CLK2 is low at the input terminal In2, and the values are 0V and −3.3V, respectively. Since the gate electrode G is coupled to the drain electrode D in each of the transistors T1 and T3, the transistors T1 and T3 enter saturation regions. On the other hand, the current passing through the transistors T3 and T4 are equal to each other, so the equation $K_4[2(V_{GS4}-V_{t4})V_{DS4}-V_{DS4}^2]=K_3(V_{GS3}-V_{t3})^2$ is complied with. Further in view of the equations $V_{GS3}=V_{DS3}=(-3.3-V_2)$, $V_{GS4}=(0-6)$ and $V_{DS4}=(V_2-6)$, the voltage at the voltage node V2, which is also referred to as a control signal CTL2, is properly obtained to be 2V. Likewise, due to the equality of the current passing through the transistors T1 and T2, the equation $K_2[2(V_{GS2}-V_{t2})V_{DS2}-V_{DS2}^2]=K_1(V_{GS1}-V_{t1})^2$ is complied with. Further in view of the equations $V_{GS1}=V_{DS1}=(0-V_1)$, $V_{GS2}=(V_2-6)=(2-6)$ and $V_{DS2}=(V_1-6)$, the voltage at the voltage node V1, which is also referred to as a control signal CTL1, is properly obtained to be 4V. FIG. 2C shows a voltage vs. time plot showing the relationship of voltages between the first voltage node V1 and the second voltage node V2, wherein the length/width ratios of the transistors T1, T2, T3 and T4 are 7 μm/6 μm, 6 μm/6 μm, 10 μm/6 μm and 6 μm/6 μm, respectively.

Figure 3B:
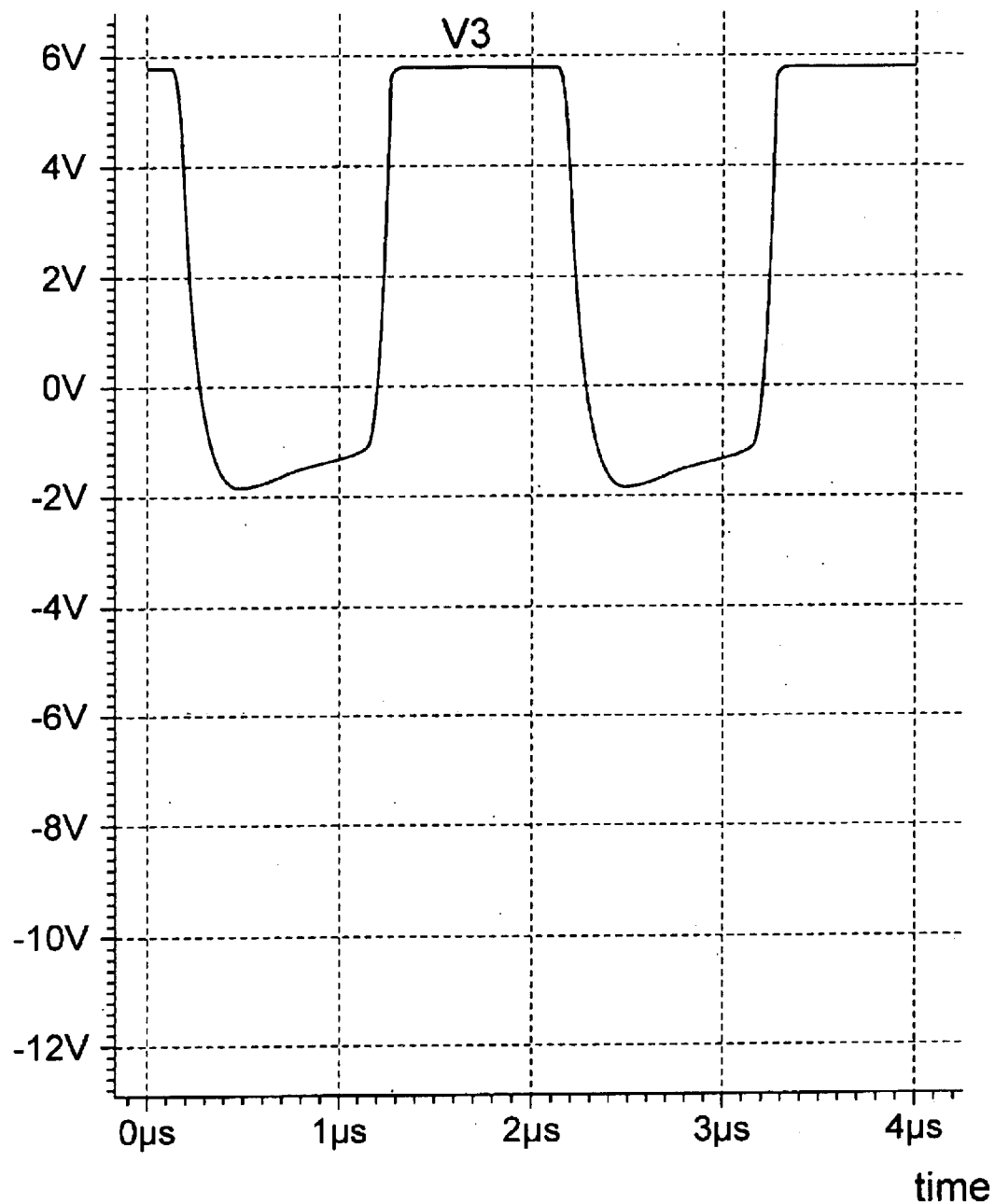
FIG. 3B is a voltage vs. time plot showing the variation of the voltage at the voltage node V3 with the voltages at the voltage nodes V1 and V2 in the switch circuit of FIG. 3A.

The voltage at the third voltage node V3, which is also referred to as a control signal CTL3, is derived from the voltages at the nodes V1 and V2, i.e. the control signals CTL1 and CTL2, as follows with reference FIG. 3A. When the voltage at the node V1 is 4V and the voltage at the node V2 is 2V, the transistor T6 of the switch circuit 20 is turned on, and the transistor T5 is turned off. Accordingly, the voltage at the third voltage node V3 is up to Vdd, i.e. 6V. FIG. 3B shows a voltage vs. time plot showing the variation of the voltage at the voltage node V3 with the voltages at the voltage nodes V1 and V2 in the switch circuit of FIG. 3A, wherein the length/width ratios of the transistors T5 and T6 are 24 μm/6 μm and 26 μm/6 μm, respectively.

Figure 4B:
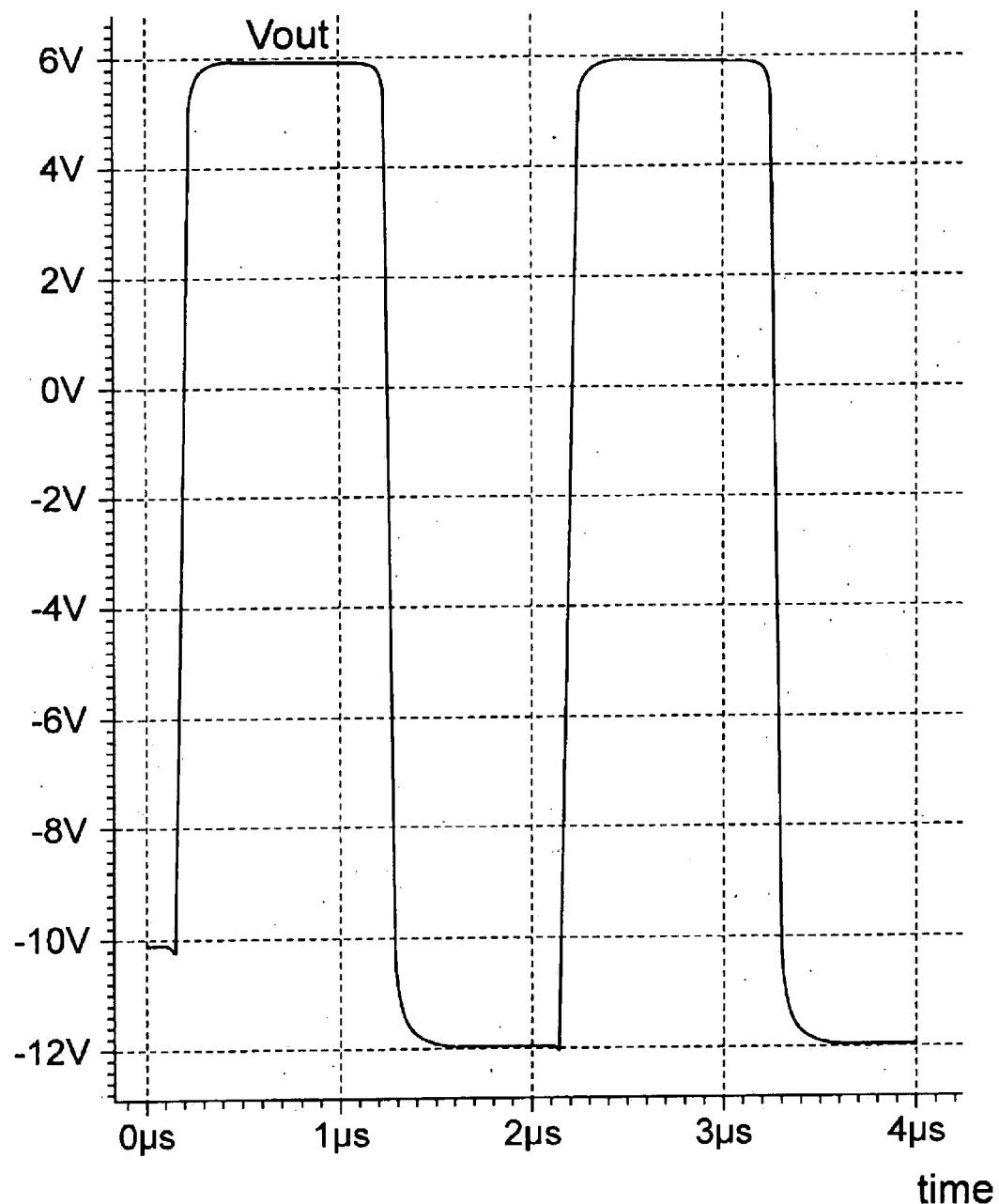
FIG. 4B is a voltage vs. time plot showing the variation of the voltage at the output voltage end Vout with the voltage at the voltage node V3 in the driving circuit of FIG. 4A.

Further referring to FIG. 4A, when the voltage at the node V3 is 6V, the transistors T7 and T10 of the driving circuit 30 are turned off, and the transistor T9 is turned on. The voltage at the output node Vout, which is also referred to as an output clock signal CLKOUT, is equal to Vss, i.e. −12V. FIG. 4B shows a voltage vs. time plot showing the variation of the voltage at the output voltage end Vout with the voltage at the voltage node V3 in the driving circuit of FIG. 4A, wherein the length/width ratios of the transistors T7, T8, T9 and T10 are 17 μm/6 μm, 6 μm/6 μm, 7 μm/6 μm and 135 μm/6 μm, respectively.

In the example with reference to FIG. 2B, the level of the clock signal is high at the input terminal In1 and low at the input terminal In2, and the values are −3.3V and 0V, respectively. Since the gate electrode G is coupled to the drain electrode D in each of the transistors T1 and T3, the transistors T1 and T3 enter saturation regions. On the other hand, the current passing through the transistors T3 and T4 are equal to each other, so the equation $K_4[2(V_{GS4}-V_{t4})V_{DS4}-V_{DS4}^2]=K_3(V_{GS3}-V_{t3})^2$ is complied with. Further in view of the equations $V_{GS3}=V_{DS3}=(0-V_2)$, $V_{GS4}=(-3.3-6)$ and $V_{DS4}=(V_2-6)$, the voltage at the voltage node V2 is properly obtained to be 4.5V. Since the transistor T2 is just turned on when the voltage at the node V2 is 4.5V, the internal resistance of the transistor T2 will be very large at the beginning, and the voltage at the node V1 will dramatically drop. Nevertheless, the steady state can be achieved in about 0.5 μs. Due to the equality of the current passing through the transistors T1 and T2, the equation $K_2[2(V_{GS2}-V_{t2})V_{DS2}-V_{DS2}^2]=K_1(V_{GS1}-V_{t1})^2$ is complied with. Further in view of the equations $V_{GS1}=V_{DS1}=(0-V_1)$, $V_{GS2}=(V_2-6)=(4.5-6)$ and $V_{DS2}=(V_1-6)$, the steady-state voltage at the voltage node V1 is −1.5V.

When the voltage at the node V1 is −1.5V and the voltage at the node V2 is 4.5V, the transistors T5 and T6 of the switch circuit 20 are both turned on. Accordingly, the stead-state voltage at the third voltage node V3 is up to −1.5V after being voltage-divided. Then, because the voltage at the node V3 is −1.5V, the transistors T7 and T10 of the driving circuit 30 are both turned on. On the other hand, the transistor T9 is turned off after the fate voltage of the transistor T9 is divided. Accordingly, the voltage at the output node Vout is equal to Vdd, i.e. 6V.

From the above illustration, it is understood that the input clock signal having a peak-to-peak value 3.3V can be converted into an input clock signal having a peak-to-peak value 18V by the voltage level shifter of the present invention. The front stage circuit 10, switch circuit 20 and driving circuit 30 are all implemented by PMOS transistors. Therefore, the manufacturing process of the present voltage level shifter is compatible with the production process of the LCD panel without involving any NMOS transistor process. In other words, the voltage level shifter can be properly integrated into the LCD panel without separately manufacturing the LCD panel and the driver IC and then combining them together, so as to reduce producing cost of the LCD.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage level shifter comprising:
    a front stage circuit periodically generating a pair of non-complementary signals including a first control signal and a second control signal having different maximum voltage levels in response to a first input clock signal and a second input clock signal complementary to said first input clock signal;
    a switch circuit including two PMOS transistors connected between a maximum voltage and a minimum voltage in series, wherein a third control signal is outputted from a conjunction of said two PMOS transistors, and said first and second control signals are coupled to the gate electrodes of said two PMOS transistors, respectively; and
    a driving circuit receiving said third control signal and outputting an output clock signal.

2. The voltage level shifter according to claim 1 wherein said front stage circuit includes:
    a first PMOS transistor having the gate and drain electrodes connected to each other and further coupled to said first input clock signal, and the source electrode serving as an output end of said first control signal;
    a second PMOS transistor having the gate electrode serving as an output end of said second control signal, the drain electrode coupled to said output end of said first control signal and the source electrode coupled to said maximum voltage;
    a third PMOS transistor having the gate and drain electrodes connected to each other and further coupled to said second input clock signal, and the source electrode coupled to said output end of said second control signal; and
    a fourth PMOS transistor having the gate electrode coupled to said first input clock signal, the drain electrode coupled to said output end of said second control signal and the source electrode coupled to said maximum voltage.

3. The voltage level shifter according to claim 1 wherein said driving circuit includes:
    a fifth PMOS transistor having the gate electrode coupled to said third control signal, the source electrode coupled to said maximum voltage and the drain electrode serving as a voltage node;
    a sixth PMOS transistor having the gate and drain electrodes connected to each other and further coupled to said minimum voltage and the source electrode coupled to said voltage node;
    a seventh PMOS transistor having the gate electrode coupled to said voltage node, the source electrode coupled to said output end of said output clock signal and the drain electrode coupled to said minimum voltage; and
    an eighth PMOS transistor having the gate electrode coupled to said third control signal, the drain electrode coupled to said output end of said output clock signal, and the source electrode coupled to said maximum voltage.

4. The voltage level shifter according to claim 1 wherein said output clock signal has a peak-to-peak value larger than a peak-to-peak value of said input clock signal.

5. A voltage level shifter comprising:
    a first PMOS transistor having the gate electrode and the drain electrode connected to each other and further coupled to an input clock signal and the source electrode serving as an output end of a first control signal;
    a second PMOS transistor having the gate electrode serving as an output end of a second control signal, the drain electrode coupled to said output end of said first control signal and the source electrode coupled to a maximum voltage;
    a third PMOS transistor having the gate electrode and the drain electrode connected to each other and further coupled to a complementary signal relative to said input clock signal, the source electrode coupled to said output end of said second control signal;
    a fourth PMOS transistor having the gate electrode coupled to said input clock signal, the drain electrode coupled to said output end of said second control signal and the source electrode coupled to said maximum voltage;
    a switch circuit periodically generating a third control signal in response to said first and second control signals; and
    a driving circuit receiving said third control signal and outputting an output clock signal having a peak-to-peak value larger than a peak-to-peak value of said input clock signal.

6. The voltage level shifter according to claim 5 wherein said switch circuit includes:
    a fifth PMOS transistor having the gate electrode coupled to said first control signal, the drain electrode coupled to a minimum voltage and the source electrode serving as an output end of said third control signal; and
    a sixth PMOS transistor having the gate electrode coupled to said second control signal, the drain electrode coupled said output end of said third control signal and the source electrode coupled to said maximum voltage.

7. The voltage level shifter according to claim 5 wherein said driving circuit includes:
    a seventh PMOS transistor having the gate electrode coupled to said third control signal, the source electrode coupled to said maximum voltage and the drain electrode serving as a voltage node;
    an eighth PMOS transistor having the gate and drain electrodes connected to each other and further coupled to said minimum voltage and the source electrode coupled to said voltage node;
    a ninth PMOS transistor having the gate electrode coupled to said voltage node, the source electrode coupled to said output end of said output clock signal and the drain electrode coupled to said minimum voltage; and
    a tenth PMOS transistor having the gate electrode coupled to said third control signal, the drain electrode coupled to said output end of said output clock signal, and the source electrode coupled to said maximum voltage.

8. A voltage level shifter for converting an input clock signal into an output clock signal, comprising:
    a front stage circuit periodically generating a first control signal and a second control signal in response to said input clock signal and a complementary clock signal relative to said input clock signal;
    a switch circuit periodically generating a third control signal in response to said first and second control signals;
    a first PMOS transistor having the gate electrode coupled to said third control signal, the source electrode coupled to a maximum voltage and the drain electrode serving as a voltage node;
    a second PMOS transistor having the gate and drain electrodes connected to each other and further coupled to a minimum voltage and the source electrode coupled to said voltage node;

a third PMOS transistor having the gate electrode coupled to said voltage node, the source electrode coupled to an output end of said output clock signal and the drain electrode coupled to said minimum voltage; and a fourth PMOS transistor having the gate electrode coupled to said third control signal, the drain electrode coupled to said output end of said output clock signal, and the source electrode coupled to said maximum voltage.

9. The voltage level shifter according to claim 8 wherein said front stage circuit includes:

a fifth PMOS transistor having the gate and drain electrodes connected to each other and further coupled to said input clock signal, and the source electrode serving as an output end of said first control signal;

a sixth PMOS transistor having the gate electrode serving as an output end of said second control signal, the drain electrode coupled to said output end of said first control signal and the source electrode coupled to said maximum voltage;

a seventh PMOS transistor having the gate and drain electrodes connected to each other and further coupled to said complementary clock signal, and the source electrode coupled to said output end of said second control signal;

an eighth PMOS transistor having the gate electrode coupled to said input clock signal, the drain electrode coupled to said output end of said second control signal and the source electrode coupled to said maximum voltage.

10. The voltage level shifter according to claim 8 wherein said switch circuit includes:

a ninth PMOS transistor having the gate electrode coupled to said first control signal, the drain electrode coupled to said minimum voltage and the source electrode serving as an output end of said third control signal; and a tenth PMOS transistor having the gate electrode coupled to said second control signal, the drain electrode coupled said output end of said third control signal and the source electrode coupled to said maximum voltage.

* * * * *